(12) United States Patent
Muhammad

(10) Patent No.: US 8,462,030 B2
(45) Date of Patent: Jun. 11, 2013

(54) PROGRAMMABLE LOOP FILTER FOR USE WITH A SIGMA DELTA ANALOG-TO-DIGITAL CONVERTER AND METHOD OF PROGRAMMING THE SAME

(75) Inventor: Khurram Muhammad, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 2040 days.

(21) Appl. No.: 10/832,531

(22) Filed: Apr. 27, 2004

(65) Prior Publication Data

US 2005/0237233 A1  Oct. 27, 2005

(51) Int. Cl.
*H03M 3/00* (2006.01)
(52) U.S. Cl.
USPC ............................................ 341/143; 341/144
(58) Field of Classification Search
USPC .. 341/143, 144, 172, 155, 150, 156; 704/262; 333/17.1
See application file for complete search history.

(56) References Cited

U.S. PATENT DOCUMENTS

| | | | |
|---|---|---|---|
| 5,068,660 A * | 11/1991 | Swanson et al. | 341/143 |
| 5,103,228 A | 4/1992 | Voorman et al. | |
| 5,124,705 A | 6/1992 | Voorman | |
| 5,204,756 A * | 4/1993 | Chevion et al. | 382/239 |
| 5,471,209 A | 11/1995 | Sutterlin et al. | |
| 6,064,962 A * | 5/2000 | Oshikiri et al. | 704/262 |
| 6,577,258 B2 | 6/2003 | Ruha et al. | |
| 6,583,741 B1 * | 6/2003 | Knudsen | 341/143 |
| 6,628,468 B1 * | 9/2003 | Du | 360/53 |
| 6,894,632 B1 * | 5/2005 | Robinson | 341/143 |
| 7,327,406 B2 * | 2/2008 | Utsunomiya et al. | 348/731 |
| 2002/0180829 A1 | 12/2002 | Liu et al. | |

* cited by examiner

*Primary Examiner* — Joseph Lauture
(74) *Attorney, Agent, or Firm* — Ronald O. Neerings; Wade James Brady, III; Frederick J. Telecky, Jr.

(57) ABSTRACT

The present invention is directed to a programmable loop filter, a method of programming the same and a sigma delta analog-to-digital converter (ADC) incorporating the programmable loop filter or the method. In one embodiment, the programmable loop filter includes: (1) a configurable filter structure containing selectably interconnectable alternative filter elements and (2) a configuration controller coupled to the configurable filter structure and operable to interconnect at least a selected one of the filter elements to determine a transfer characteristic of the configurable filter structure and set an operating condition of the sigma delta ADC.

34 Claims, 3 Drawing Sheets

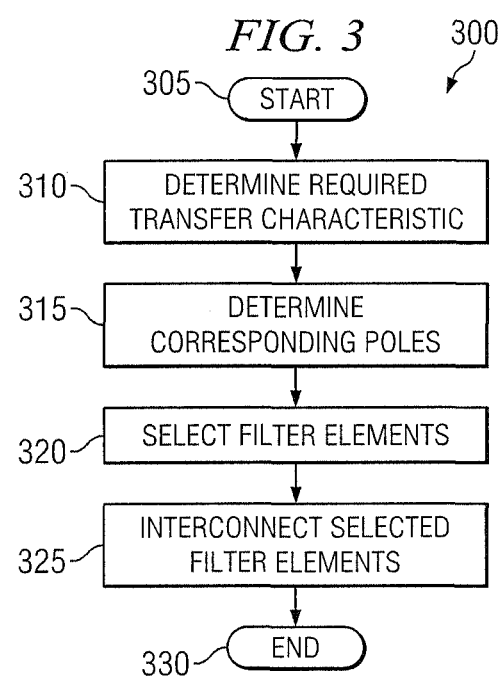

PROGRAMMABLE LOOP FILTER FOR USE WITH A SIGMA DELTA ANALOG-TO-DIGITAL CONVERTER AND METHOD OF PROGRAMMING THE SAME

TECHNICAL FIELD OF THE INVENTION

The present invention is directed, in general, to analog-to-digital converters (ADCs) and, more specifically, to a programmable loop filter for use with a sigma delta ADC and method of programming the same.

BACKGROUND OF THE INVENTION

An analog input signal can be converted into a digital output word using an analog-to-digital converter (ADC), which contains a mixture of analog and digital circuitry. The speed, resolution and linearity of the conversion affects the accuracy with which the digital output word represents the analog input signal. The conversion speed must be high enough to sample the shortest analog input signal period (highest analog signal frequency) at least twice. The conversion resolution is determined by the number of bits in the digital output word and has to be large enough to resolve the maximum peak-to-peak analog input signal into a required degree of granularity. The conversion linearity has to be sufficient to operate at or preferably below a required maximum level of distortion associated with the conversion process.

Several different algorithms and architectures exist that may be employed to accomplish a conversion. These include sigma delta, successive approximation, pipeline and flash ADCs in increasing order of bandwidth capability. Of particular interest is the sigma delta ADC, which typically provides a reasonable trade-off between sampling rate and bits of resolution while providing a low component count that benefits cost of production, size and reliability.

The sigma delta ADC employs sigma delta modulation techniques that digitize an input signal using very low resolution (one-bit) and a very high sampling rate (often in the megahertz range). Oversampling and the use of digital filters increases the resolution to as many as twenty or more bits. It is especially useful for high resolution conversion of low to moderate frequency signals as well as low distortion conversion of signals containing audio frequencies due to its inherent qualities of good linearity and high accuracy.

In its basic form, the sigma delta ADC employs an input modulator and an output digital filter and decimator. The input modulator operates by accepting an input signal through an input summing junction, which feeds a loop filter. The loop filter basically provides an integrated value of this signal to a comparator, which acts as a one-bit quantizer. The comparator output signal is fed back to the input summing junction through a circuit acting as a one-bit digital to analog converter. The feedback loop forces the average of the feedback signal to be substantially equal to the input signal. The density of "ones" in the comparator output signal is proportional to the value of the input signal. The input modulator oversamples the input signal by clocking the comparator at a rate that is much higher than the Nyquist rate. Then, the output digital filter and decimator produce output data words at a data rate appropriate to the conversion.

Quantization noise (or quantization error) is one of the factors that limits the dynamic range of an ADC. When an analog input signal is quantized, the quantization error is actually the "round off" error that occurs and has a magnitude that is typically one-half the value represented by the conversions least significant bit. The quantization error is usually random and therefore may be treated as white noise. An input signal sampled at the Nyquist rate has its associated quantization noise folded into the input signal bandwidth.

Oversampling the input signal causes the quantization noise to be spread over a wider bandwidth thereby reducing the level of quantization noise in the signal bandwidth by the oversampling ratio (oversampling rate/Nyquist rate). Additionally, the oversampled modulator also redistributes energy from the signal bandwidth to higher frequencies thereby providing further advantageous noise shaping.

General purpose sigma delta ADCs are often designed to be employed in a spectrum of applications having differing input signal bandwidth requirements. For example, one application may only require that a bandwidth of 10 kHz be accommodated while another application may require a bandwidth of 100 kHz. For this case, the input modulator of the sigma delta ADC would have to accommodate an input signal bandwidth of at least 100 kHz. Accommodating this 100 kHz bandwidth establishes an equivalent noise level and thereby a dynamic range for the ADC. Unfortunately, this dynamic range is less than a dynamic range that the sigma delta ADC could provide for an input signal bandwidth of only 10 kHz.

Accordingly, what is needed in the art is a way for a general purpose sigma delta ADC to provide a dynamic range commensurate with an input signal bandwidth.

SUMMARY OF THE INVENTION

To address the above-discussed deficiencies of the prior art, the present invention provides a programmable loop filter, a method of programming the same and a sigma delta analog-to-digital converter (ADC) incorporating the programmable loop filter or the method. In one embodiment, the programmable loop filter includes: (1) a configurable filter structure containing selectably interconnectable alternative filter elements and (2) a configuration controller coupled to the configurable filter structure and operable to interconnect at least a selected one of the filter elements to determine a transfer characteristic of the configurable filter structure and set an operating condition of the sigma delta ADC.

In another aspect, the present invention provides a method of programming a loop filter for use with a sigma delta analog-to-digital converter (ADC). The method includes: (1) selecting, from a configurable filter structure containing selectably interconnectable alternative filter elements, at least one of the filter elements and (2) interconnecting the at least the one of the filter elements to determine a transfer characteristic of the configurable filter structure and set an operating condition of the sigma delta ADC.

The present invention also provides, in yet another aspect, a modulator for use with a sigma delta analog-to-digital converter (ADC). The modulator includes an input signal summing junction and a programmable loop filter, coupled to an output of the summing junction. The programmable loop filter has a configurable filter structure that contains selectably interconnectable alternative filter elements, and, a configuration controller, coupled to the configurable filter structure, that operates to interconnect at least a selected one of the filter elements to determine a transfer characteristic of the configurable filter structure and set an operating condition of the sigma delta ADC. The modulator also includes a one-bit quantizer, coupled to an output of the programmable loop filter, and a one-bit digital-to-analog converter coupled between an output of the one-bit quantizer and the summing junction.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which:

FIG. 3 illustrates a flow diagram of an embodiment of a method of programming a loop filter carried out in accordance with the principles of the present invention.

DETAILED DESCRIPTION

Figure 1:
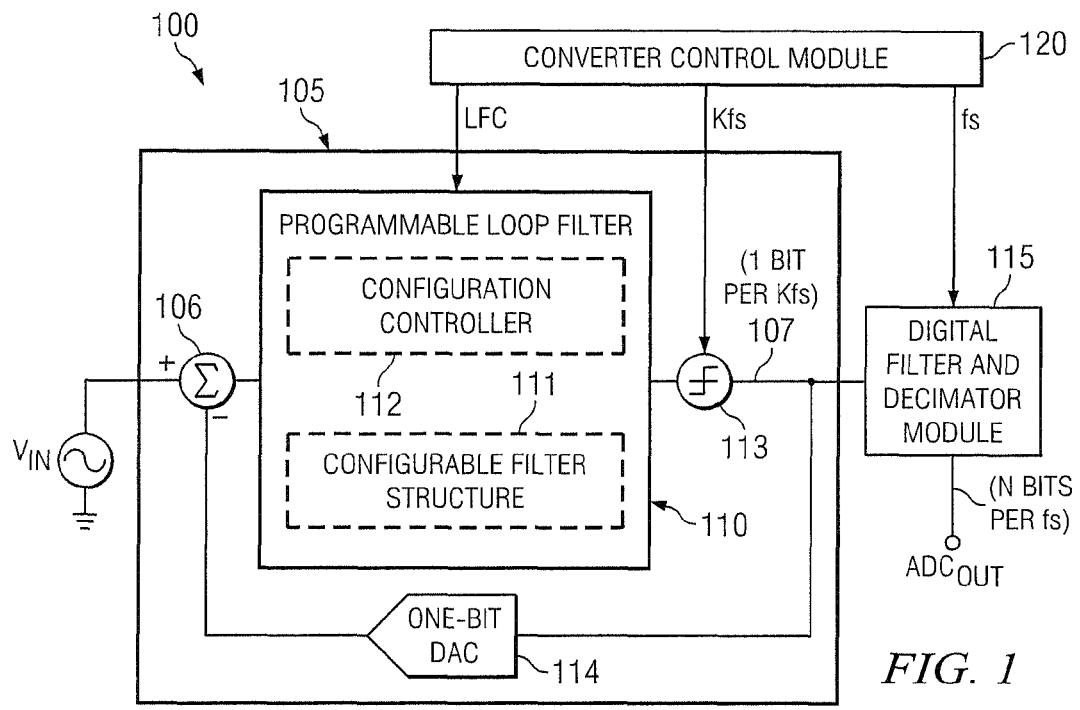
FIG. 1 illustrates a diagram of an embodiment of a sigma delta analog-to-digital converter (ADC) employing a programmable loop filter constructed in accordance with the principles of the present invention.

Referring initially to FIG. 1, illustrated is a diagram of an embodiment of a sigma delta analog-to-digital converter (ADC), generally designated 100, employing a modulator 105 constructed in accordance with the principles of the present invention. The sigma delta ADC 100 includes the modulator 105 that receives an input signal voltage Vin, a digital filter and decimator module 115 that provides a converter output signal $ADC_{out}$ and a converter control module 120. The modulator 105 includes a summing junction 106, a programmable loop filter 110, a one-bit quantizer 113 and a one-bit digital-to-analog converter (DAC) 114. The programmable loop filter 110 includes a configuration filter structure 111 and a configuration controller 112.

The sigma delta ADC 100 converts the input signal voltage $V_{in}$ into the converter output signal $ADC_{out}$. The modulator 105 quantizes the input signal voltage $V_{in}$ and provides a modulator output signal 107, which is an oversampled digital signal, to the digital filter and decimator module 115. An oversampling frequency $Kf_s$ for the one-bit quantizer 113 and a sampling frequency $f_s$ for the digital filter and decimator module 115 are provided by the converter control module 120. These are determined by a required bit-resolution of the conversion and a highest frequency associated with the input signal voltage $V_{in}$, respectively. The modulator output signal 107 provides a serial bitstream that produces one bit for each period of the oversampling frequency $Kf_s$. This is transformed for the converter output signal $ADC_{out}$ into a parallel digital word having N bits for each period of the sampling frequency $f_s$, where N is the number of bits associated with the conversion.

The modulator 105 receives the input signal voltage Vin employing the summing junction 106, as shown. The output of the summing junction 106 provides an average error signal between the input signal voltage Vin and the output of the one-bit DAC 114, which reflects the inverse of the state of the oversampled digital signal 107. The programmable loop filter 110 processes this average error signal for quantization by the one-bit quantizer 113.

The programmable loop filter 110 employs the configurable filter structure 111, which contains selectably interconnectable alternative filter elements, to form a transfer characteristic that includes a low pass frequency response. Additionally, the programmable loop filter 110 couples the configuration controller 112 to the configurable filter structure 111 and interconnects at least one of the filter elements thereby determining at least one pole of the transfer characteristic of the configurable filter structure 111. This action is initiated by a loop filter control signal LFC from the converter control module 120 and sets an operating condition of the sigma delta ADC 100. The operating condition may accommodate a particular application employing an industry standard, such as Bluetooth support in a Global System for Mobile Communications (GSM) receiver. Additionally, one or more industry standards may also be employed to tune the sigma delta ADC 100 for best performance within a desired bandwidth. Generally, by changing the transfer characteristic of the programmable loop filter 110, the signal-to-quantization noise ratio of the sigma delta ADC 100 may be enhanced thereby increasing its overall signal-to-noise ratio and dynamic range for the particular application.

Alternative embodiments of a sigma delta ADC may be constructed in accordance with the principles of the present invention. In one embodiment, the feedback employed may be multi-bit using a multi-bit DAC wherein the associated bit stream may become a symbol stream. In another embodiment, more than one feedback loop may be employed wherein the feedback provided is single bit, multi-bit or a combination of the two. Additionally, the configurable filter structure may employ one or more low pass or bandpass filters wherein at least a selected one of the filter elements is operable to be interconnected by a configuration controller. In yet another embodiment, a plurality of summing junctions or summing nodes may be employed that are typically separated by one or more programmable filters. In general, the programmable filters employed in an embodiment may have passive or active components or a combination of both.

Figure 2A:
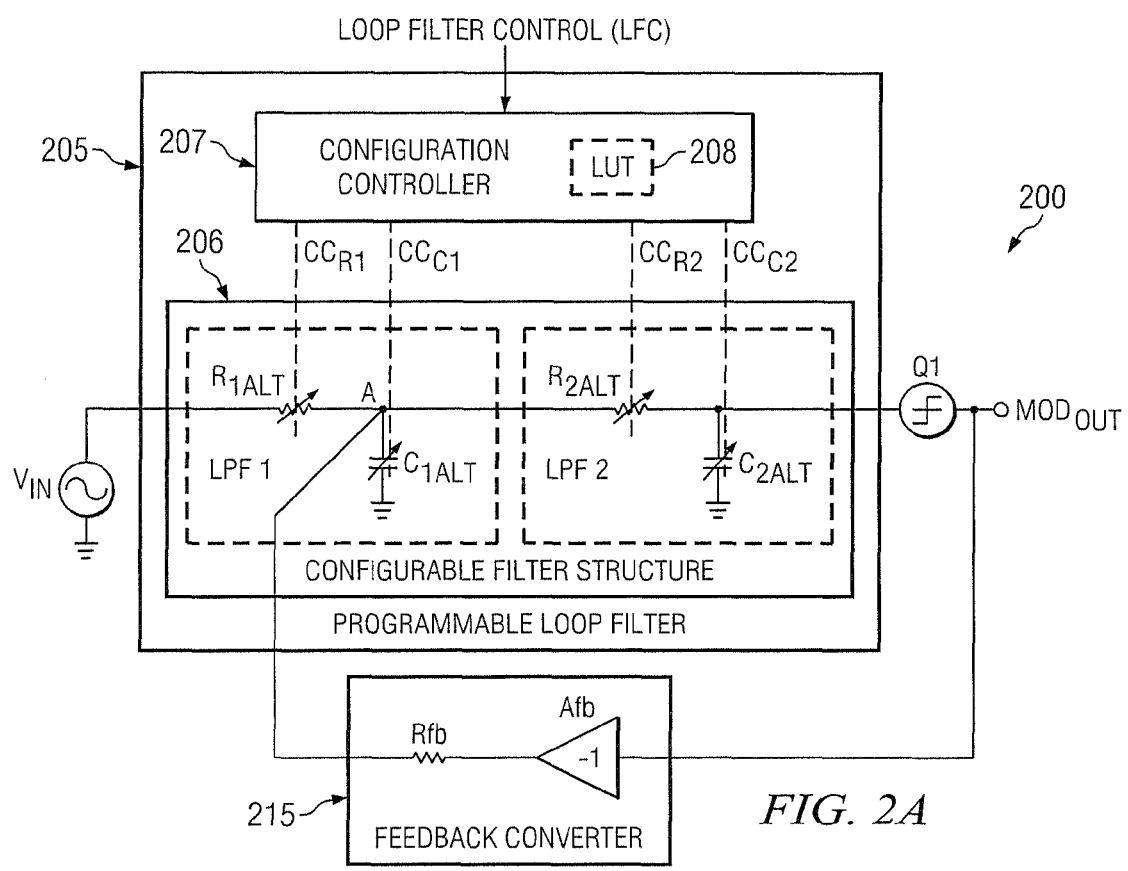
FIG. 2A illustrates a diagram of an embodiment of a modulator employing a programmable loop filter constructed in accordance with the principles of the present invention.

Turning now to FIG. 2A, illustrated is a diagram of an embodiment of a modulator, generally designated 200, employing a programmable loop filter 205 constructed in accordance with the principles of the present invention. The modulator 200 may be used with a sigma delta ADC and includes the programmable loop filter 205 coupled to an input signal $V_{in}$, a quantizer Q1 having a modulator output signal $MOD_{out}$ and a feedback converter 215 having a feedback amplifier $A_{fb}$ and a feedback resistor $R_{fb}$. The programmable loop filter 205 includes a configurable filter structure 206 and a configuration controller 207. The configurable filter structure 206 includes first and second low pass filters LPF1, LPF2. The configuration controller 207 includes a look-up table 208.

Operation of the modulator 200 parallels that of the modulator 105 discussed with respect to FIG. 1. The modulator output signal MODout provides one bit per oversampled quantization period having a bipolar output state, as before. The feedback converter 215 employs the feedback amplifier Afb to invert the modulator output signal MODout and apply it using the feedback resistor Rfb. A summing node A replaces the summing junction 106 of FIG. 1 to produce an error signal for the modulator 200.

The first and second low pass filters LPF1, LPF2 contain selectably interconnectable alternative filter elements. The first low pass filter LPF1 includes first alternative resistive filter elements $R_{1ALT}$ and first alternative capacitive filter elements $C_{1ALT}$. Similarly, the second low pass filter LPF2 includes second alternative resistive filter elements $R_{2ALT}$ and second alternative capacitive filter elements $C_{2ALT}$. The configuration controller 207 receives a loop filter control command LFC that provides a general instruction regarding a transfer characteristic required to enhance a particular application.

In response, the configuration controller 207 provides first filter resistive and capacitive control commands $CC_{R1}$, $CC_{C1}$ and second filter resistive and capacitive control commands $CC_{R2}$, $CC_{C2}$. These commands respectively select the appropriate filter elements to determine the required transfer characteristic for the low pass frequency responses associated with the first and second low pass filters LPF1, LPF2. In the illustrated embodiment, the look-up table 208 is employed to determine at least one of the filter elements. Alternatively, an appropriate polynomial equation may be employed instead of the look-up table 208. This action determines at least one pole of the configurable filter structure 206 and sets an operating condition of the sigma delta ADC that enhances a signal to noise ratio for the application.

In the illustrated embodiment, the configurable filter structure 206 may employ a passive implementation using cascaded IIR filter stages having either switched capacitor passive filter stages, cascaded RC filter stages or a combination of both. The programmable loop filter 205 may also be employed in multiple applications (corresponding to multiple industry standards) wherein its poles are determined by selecting appropriate capacitance ratios in the switched capacitor implementation or varying a capacitor size in the continuous time-domain implementation. Of course, other passive implementations may be employed, as well as an active filter implementation as appropriate to a particular sigma delta ADC design. Additionally, selection of the poles may also be employed to tune a dynamic range of the sigma delta ADC to compensate for component tolerances within a particular application.

Table 1, below, indicates the effect of various filter pole locations on the signal-to-noise (S/N) ratio for several bandwidths. As shown, positioning of these filter poles may result in a significant difference in the S/N ratio and therefore the dynamic range of the associated sigma delta ADC.

TABLE 1

S/N ratio for a sinusoidal 100 KHz tone

| LPF1 Pole (KHz) | LPF2 Pole (KHz) | S/N Ratios for Bandwidths Shown (N = Thermal + Quantization) | | |
|---|---|---|---|---|
| | | 200 KHz | 1 MHz | 3 MHz |
| 325 | 3300 | 62.52 | 55.10 | 40.71 |
| 1000 | 3300 | 63.07 | 58.20 | 47.95 |
| 2000 | 3300 | 62.52 | 57.33 | 49.97 |
| 3000 | 3300 | 61.77 | 55.83 | 49.43 |
| 325 | 5000 | 63.53 | 54.82 | 41.41 |
| 1000 | 5000 | 62.99 | 57.38 | 47.86 |
| 2000 | 5000 | 61.63 | 55.62 | 48.71 |
| 3000 | 5000 | 59.33 | 53.35 | 47.34 |

Figure 2B:
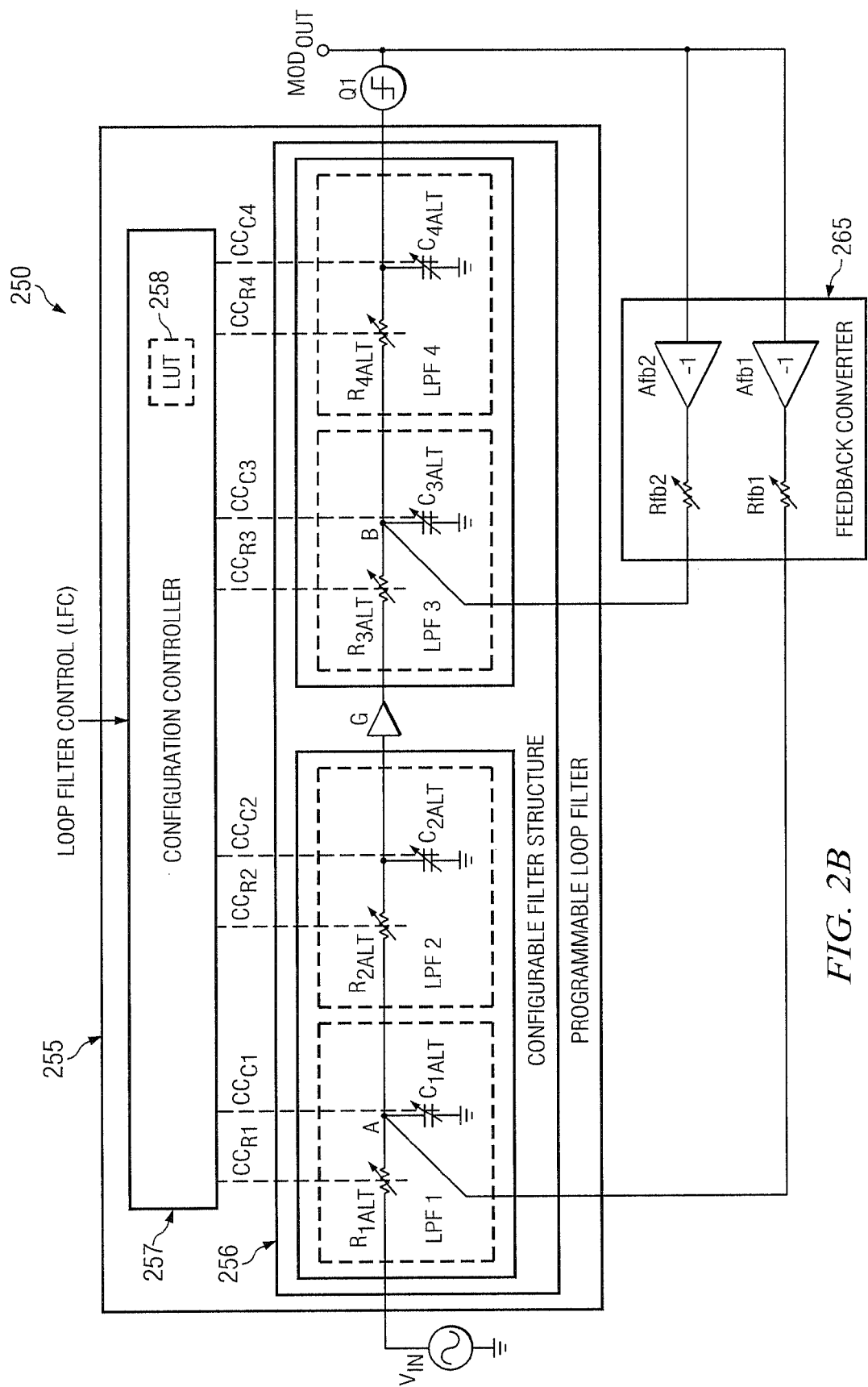
FIG. 2B illustrates an alternative embodiment of a modulator employing an alternative programmable loop filter constructed in accordance with the principles of the present invention.

Turning now to FIG. 2B, illustrated is an alternative embodiment of a modulator, generally designated 250, employing an alternative programmable loop filter 255 constructed in accordance with the principles of the present invention. The modulator 250 may also be used with a sigma delta ADC and includes the alternative programmable loop filter 255 coupled to an input signal $V_{in}$, a quantizer Q1 having a modulator output signal $MOD_{out}$ and a feedback converter 265 having first and second feedback amplifiers $A_{fb}1$, $A_{fb}2$ respectively coupled to first and second feedback resistors $R_{fb1}$, $R_{fb2}$. The programmable loop filter 255 includes a configurable filter structure 256 and a configuration controller 257. The configurable filter structure 256 includes first and second, low pass filters LPF1, LPF2, as before, and third and fourth low pass filters LPF3, LPF4, which are coupled by an active coupling element G. The configuration controller 257 includes a look-up table 258, but an appropriate polynomial equation may also be employed, as before.

Operation of the modulator 250 generally parallels the operation of the modulator 200, as was discussed with respect to FIG. 2A. However, the modulator 250 employs two summing nodes A and B to accommodate the two outputs from the first and second feedback resistors $R_{fb1}$, $R_{fb2}$ in the feedback converter 265, as shown. The first and second feedback resistors $R_{fb1}$, $R_{fb2}$ may be scaled to accommodate needed signal magnitudes at the two summing nodes A and B. The configuration controller 257 provides additional third and fourth resistive control commands $CC_{R3}$, $CC_{R4}$ and third and fourth capacitive control commands $CC_{C3}$, $CC_{C4}$ to the third and fourth low pass filters LPF3, LPF4, respectively. The configurable filter structure 256 employs the active coupling element G to maintain a required signal level between the second and third low pass filters LPF2, LPF3. Of course, bandpass filters may also be employed in the configurable filter structure 256, as may be appropriate to a particular requirement.

Turning now to FIG. 3, illustrated is a flow diagram of an embodiment of a method of programming a loop filter, generally designated 300, carried out in accordance with the principles of the present invention. The method 300 may be used with a sigma delta ADC and starts in a step 310 with an intent to provide a loop filter response that will enhance a dynamic range of the sigma delta ADC for a particular application based on an industry standard. Then an appropriate filter transfer response for the application, which includes a low pass frequency response, is determined in a step 310.

The corresponding poles, associated with the low pass frequency response, are then determined in a step 315. One or more filter elements are selected from a configurable filter structure containing alternative filter elements that are selectably interconnectable, in the step 315. These alternative filter elements may be selected from the group consisting of analog filter elements and digital filter elements. These selections may employ a look-up table to facilitate the selecting process. Alternatively, the method 300 may calculate the required one or more filter elements and their interconnections needed to generate the poles of the required filter transfer characteristic. Then, in a step 325, the one or more filter elements are interconnected to determine the required filter transfer characteristic. This action sets an operating condition that improves a S/N ratio for the particular application of the sigma delta ADC. The method 300 ends in a step 330.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order and/or the grouping of the steps are not limitations of the present invention.

In summary, embodiments of the present invention employing a programmable loop filter and method of programming a loop filter have been presented. Advantages include the ability to select at least one filter pole and determine a filter transfer characteristic that enhances the performance of an associated sigma delta ADC. The programmable loop filter and method may also be employed to tune or enhance a filter response that would otherwise be de-tuned due to component tolerances.

Although the present invention has been described in detail, those skilled in the art should understand that they can make various changes, substitutions and alterations herein without departing from the spirit and scope of the invention in its broadest form.

What is claimed is:

1. A programmable loop filter for use with a sigma delta analog-to-digital converter (ADC), comprising:
   a configurable passive filter structure containing selectably interconnectable alternative filter elements; and
   a configuration controller coupled to said configurable passive filter structure and operable to interconnect at least a selected one of said filter elements to determine a transfer characteristic of said configurable passive filter structure and set an operating condition of said sigma delta ADC.

2. The programmable loop filter recited in claim 1 wherein said alternative filter elements determine at least one pole of said configurable filter structure.

3. The programmable loop filter recited in claim 1 wherein said operating condition improves a signal-to-noise ratio of said sigma delta ADC.

4. The programmable loop filter recited in claim 1 wherein a look-up table is employed to determine said at least said selected one of said filter elements.

5. The programmable loop filter recited in claim 1 wherein an industry standard is employed to establish said operating condition.

6. The programmable loop filter recited in claim 1 wherein said alternative filter elements are selected from the group consisting of
   analog filter elements, and
   digitalfilter elements.

7. The programmable loop filter recited in claim 1 wherein said transfer characteristic includes a low pass frequency response.

8. The programmable loop filter of claim 1 wherein quantization noise is shaped by the loop filter.

9. The programmable loop filter of claim 1, wherein the sigma delta analog-to-digital converter (ADC) is a second order sigma-delta ADC.

10. The programmable loop filter of claim 1, wherein the sigma delta analog-to-digital converter (ADC) is a fourth order sigma-delta ADC.

11. The programmable loop filter of claim 1, wherein the configurable passive filter structure comprises at least two noise shaping loops.

12. The programmable loop filter of claim 1 wherein the configurable passive filter structure comprises cascaded IIR filter stages.

13. The programmable loop filter of claim 12, wherein the configurable passive filter structure comprises cascaded IIR filter stages are one of: switched capacitor filter stages; cascaded RC filter stages; a combination of switched capacitor and cascaded RC filter stages.

14. A method of programming a loop filter for use with a sigma delta analog-to-digital converter (ADC), comprising:
   selecting, from a configurable passive filter structure containing selectably interconnectable alternative filter elements, at least one of said filter elements; and
   interconnecting said at least said one of said filter elements to determine a transfer characteristic of said configurable passive filter structure and set an operating condition of said sigma delta ADC.

15. The method as recited in claim 14 wherein said alternative filter elements determine at least one pole of said configurable passive filter structure.

16. The method as recited in claim 14 wherein said operating condition improves a signal-to-noise ratio of said sigma delta ADC.

17. The method as recited in claim 14 wherein said selecting comprises employing a look-up table.

18. The method as recited in claim 14 wherein an industry standard is employed to establish said operating condition.

19. The method as recited in claim 14 wherein said alternative filter elements are selected from the group consisting of:
   analog filter elements, and
   digital filter elements.

20. The method as recited in claim 14 wherein said transfer characteristic includes a low pass frequency response.

21. The method of programming a loop filter for use with a sigma delta analog-to-digital converter (ADC) of claim 14, wherein the configurable passive filter structure comprises cascaded IIR filter stages.

22. The method of programming a loop filter for use with a sigma delta analog-to-digital converter (ADC) of claim 21, wherein the configurable passive filter structure comprises cascaded IIR filter stages are one of: switched capacitor filter stages;
   cascaded RC filter stages; a combination of switched capacitor and cascaded RC filter stages.

23. A modulator for use with a sigma delta analog-to-digital converter (ADC), comprising:
   a summing junction coupled to an input signal;
   a programmable loop filter, coupled to an output of said summing junction, including:
      a configurable passive filter structure that contains selectably interconnectable alternative filter elements, and
      a configuration controller coupled to said configurable filter structure that operates to interconnect at least a selected one of said filter elements to determine a transfer characteristic of said configurable passive filter structure and set an operating condition of said sigma delta ADC;
   a one-bit quantizer coupled to an output of said programmable loop filter; and
   a one-bit digital-to-analog converter coupled between an output of said one-bit quantizer and said summing junction.

24. The modulator as recited in claim 23 wherein said alternative filter elements determine at least one pole of said configurable passive filter structure.

25. The modulator as recited in claim 23 wherein said operating condition improves a signal-to-noise ratio of said sigma delta ADC.

26. The modulator as recited in claim 23 wherein a look-up table is employed to determine said at least said selected one of said filter elements.

27. The modulator as recited in claim 23 wherein an industry standard is employed to establish said operating condition.

28. The modulator as recited in claim 23 wherein said alternative filter elements are selected from the group consisting of:
   analog filter elements, and
   digital filter elements.

29. The modulator as recited in claim 23 wherein said transfer characteristic includes a low pass frequency response.

30. The modulator for use with a sigma delta analog-to-digital converter (ADC) of claim 23, wherein the configurable passive filter structure comprises cascaded IIR filter stages.

31. The modulator for use with a sigma delta analog-to-digital converter (ADC) of claim 30, wherein the configurable passive filter structure comprises cascaded IIR filter stages are one of: switched capacitor filter stages; cascaded RC filter stages; a combination of switched capacitor and cascaded RC filter stages.

32. A programmable loop filter for use with a sigma delta analog-to-digital converter (ADC), comprising:
    a configuration controller coupled to a configurable passive filter structure and operable to interconnect at least one of selectably interconnectable filter elements in said configurable passive filter structure to determine a transfer characteristic of said configurable passive filter structure and set an operating condition of said sigma delta ADC.

33. The programmable loop filter for use with a sigma delta analog-to-digital converter (ADC) of claim 32, wherein the configurable passive filter structure comprises cascaded IIR filter stages.

34. The programmable loop filter for use with a sigma delta analog-to-digital converter (ADC) of claim 33, wherein the configurable passive filter structure comprises cascaded IIR filter stages are one of: switched capacitor filter stages; cascaded RC filter stages; a combination of switched capacitor and cascaded RC filter stages.

\* \* \* \* \*